United States Patent
Lopez-Diaz et al.

(10) Patent No.: US 11,784,578 B2
(45) Date of Patent: Oct. 10, 2023

(54) ELECTRONIC CIRCUIT WITH ELECTROMAGNETIC INTERFERENCE DETECTION AND SUPPRESSION AND METHOD THEREFOR

(71) Applicant: NXP B.V., Eindhoven (NL)

(72) Inventors: Daniel Lopez-Diaz, Graz (AT); Peter Thüringer, Graz (AT); Pierluigi Cavallini, Graz (AT); Hubert Watzinger, Gratwein-Strassengel (AT)

(73) Assignee: NXP B.V., Eindhoven (NL)

( * ) Notice: Subject to any disclaimer, the term of this patent is extended or adjusted under 35 U.S.C. 154(b) by 112 days.

(21) Appl. No.: 17/649,215

(22) Filed: Jan. 28, 2022

(65) Prior Publication Data

US 2023/0246564 A1   Aug. 3, 2023

(51) Int. Cl.
| | |
|---|---|
| *H02M 1/08* | (2006.01) |
| *H02M 7/219* | (2006.01) |
| *G01R 29/08* | (2006.01) |
| *H02M 1/44* | (2007.01) |
| *H02M 1/02* | (2006.01) |

(52) U.S. Cl.
CPC ............ *H02M 7/219* (2013.01); *G01R 29/08* (2013.01); *H02M 1/02* (2013.01); *H02M 1/08* (2013.01); *H02M 1/44* (2013.01)

(58) Field of Classification Search
CPC .......... H02M 7/219; H02M 1/08; H02M 1/12; H02M 1/44; G01R 29/08
See application file for complete search history.

(56) References Cited

U.S. PATENT DOCUMENTS

| | | |
|---|---|---|
| 5,564,420 A | 10/1996 | Nazarian et al. |
| 6,920,053 B2 | 7/2005 | Honda |
| (Continued) | | |

FOREIGN PATENT DOCUMENTS

| | | |
|---|---|---|
| CN | 109861566 A | 6/2019 |
| EP | 3799287 A1 | 3/2021 |
| KR | 101745475 B1 | 6/2017 |

OTHER PUBLICATIONS

Tekin, Ahmet; "A Wideband Smart EMF Detector for Mobile Devices"; Electrica, 2021; 21: 115-120; Official Journal of the Instanbul University-Cerrahpasa; DOI: 10.5152/electrica.2020.20056.

*Primary Examiner* — Adolf D Berhane
(74) *Attorney, Agent, or Firm* — Daniel D. Hill

(57) ABSTRACT

An electronic circuit is provided. The electronic circuit includes a full-bridge rectifier, a spurious tone detection circuit, and a controller. The rectifier circuit has a plurality of switching elements and first and second radio frequency (RF) terminals. The spurious tone detection circuit has a non-linear circuit element and is coupled between the first RF terminal and a first reference terminal. The spurious tone detection circuit provides a non-zero direct current (DC) voltage in response to detecting harmonic tones at the first RF terminal of the full-bridge rectifier circuit. The controller is coupled to the plurality of switching elements. The controller is for controlling the operation of the plurality of switching elements based at least in part on detecting the harmonic tones. In one embodiment, the electronic circuit may be a wireless charging receiver. In another embodiment, a method for detecting harmonic tones in the electronic device is provided.

20 Claims, 10 Drawing Sheets

(56) References Cited

U.S. PATENT DOCUMENTS

| | | |
|---|---|---|
| 9,564,948 B2 | 2/2017 | Arnold et al. |
| 10,498,160 B2 * | 12/2019 | Desai ..................... H02J 50/12 |
| 10,784,794 B2 * | 9/2020 | de Rooij ............... H02M 1/088 |
| 2009/0153248 A1 | 6/2009 | Sun |
| 2010/0148723 A1 | 6/2010 | Cook et al. |
| 2012/0063175 A1 | 3/2012 | Wang et al. |
| 2016/0176300 A1 | 6/2016 | Bucher et al. |
| 2017/0187220 A1 | 6/2017 | Rosenfeld et al. |

\* cited by examiner

US 11,784,578 B2

ELECTRONIC CIRCUIT WITH ELECTROMAGNETIC INTERFERENCE DETECTION AND SUPPRESSION AND METHOD THEREFOR

BACKGROUND

Field

This disclosure relates generally to electronics and more specifically to an electronic circuit with electromagnetic interference (EMI) detection and suppression and method therefor.

Related Art

The number of battery powered small form factor devices like smart watches and wireless headphones is on the rise and creates a demand for fast and convenient charging solutions. Wireless charging is a promising technology for charging the small form factor devices and is based on either inductive or resonant coupling of multiple coils. Wireless charging allows battery charging without the use of a physical connection between the charger and the device being charged. One of the major challenges in wireless power transmission and reception is the suppression of unwanted EMI that potentially interferes with the operation of other electronic devices.

Therefore, a need exists for a wireless charging circuit that includes detection and active suppression of unwanted EMI.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
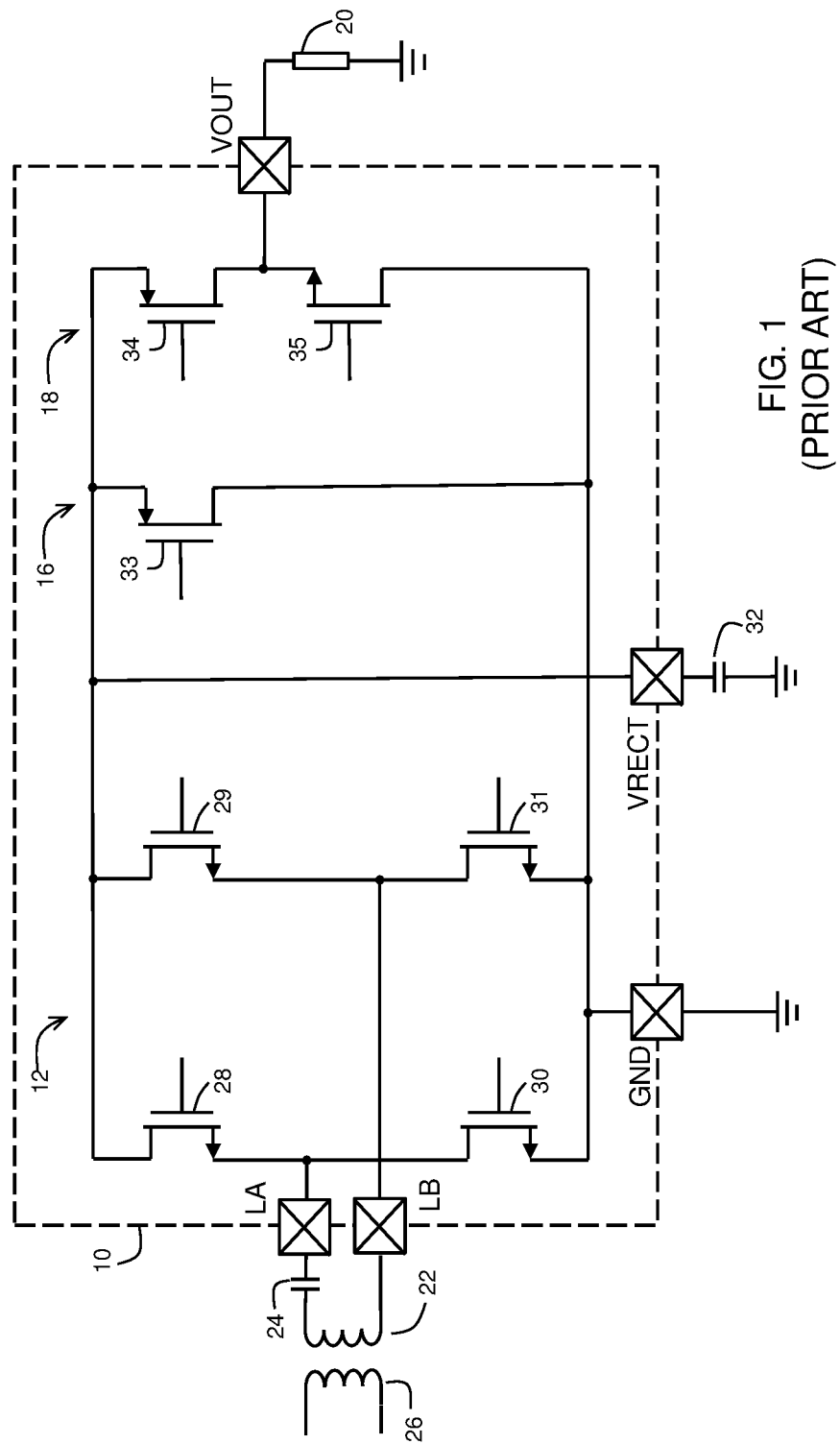
FIG. 1 illustrates a wireless charging receiver in accordance with the prior art.

Generally, there is provided, an electronic circuit including a rectifier, an on-chip spurious tone detection and regulation circuit, a receiver coil, and a controller. In one embodiment, the rectifier is a full-bridge rectifier circuit. The spurious tone detection circuit includes a non-linear circuit element, such as a diode. The spurious tone detection circuit provides a non-zero direct current (DC) voltage in response to detecting harmonic tones at first and second RF terminals of the full-bridge rectifier. A receiver coil is coupled to the first and second RF terminals for providing resonant coupling with a transmitter coil on a wireless battery charger. The controller is coupled to each switch of the full-bridge rectifier and controls the operation of the switches based on DC voltages detected by, and provided to the controller by, the spurious tone detection and regulation circuit. The controller minimizes a voltage level of the detected DC voltage by controlling the operation of the switches, for example, by adjusting an ON time of each of the switches, or by controlling the drive strength of each of the switches. Minimizing the detected DC voltage removes, or at least reduces, the harmonic tones and thus reduces EMI emission levels.

In one embodiment, there is provided, an electronic circuit including: a full-bridge rectifier circuit having first and second radio frequency (RF) terminals and a plurality of switching elements; a first spurious tone detection circuit having a first non-linear circuit element, the spurious tone detection circuit coupled between the first RF terminal and a first reference terminal, the first spurious tone detection circuit providing a first non-zero direct current (DC) voltage in response to detecting harmonic tones at the first RF terminal of the full-bridge rectifier circuit; and a controller coupled to the plurality of switching elements, the controller for controlling the operation of the plurality of switching elements based at least in part on detecting the harmonic tones. The electronic circuit may further include a second spurious tone detection circuit having a second non-linear circuit element, the second spurious tone detection circuit coupled between the second RF terminal and the first reference terminal, the second spurious tone detection circuit providing a second non-zero DC voltage in response to detecting harmonic tones at the second RF terminal of the full-bridge rectifier circuit. The electronic circuit may further include third and fourth spurious detection circuits, the third spurious tone detection circuit having a third non-linear circuit element, the third spurious tone detection circuit coupled between the first RF terminal and a second reference terminal, the third spurious tone detection circuit providing a third non-zero DC voltage in response to detecting harmonic tones at the first RF terminal of the full-bridge rectifier circuit; and the fourth spurious tone detection circuit having a fourth non-linear circuit element, the fourth spurious tone detection circuit coupled between the second RF terminal and the second reference terminal, the fourth spurious tone detection circuit providing a fourth non-zero DC voltage in response to detecting harmonic tones at the second RF terminal of the full-bridge rectifier circuit. During operation, the first reference terminal may be at a lower potential than a potential the second reference terminal. The full-bridge rectifier may include a combination of transistors and diodes. The first non-linear circuit element may be a diode. The first spurious tone detection circuit may further include: a diode having a first terminal coupled to the first RF terminal of the full-bridge rectifier, and a second terminal; a capacitor having a first terminal coupled to the second terminal of the diode, and a second terminal coupled to the first reference terminal; and a resistive element having a first terminal coupled to the second terminal of the diode, and a second terminal coupled to the first reference terminal. The controller may be coupled to receive the first non-zero DC voltage, and in response, control a drive strength of the plurality of switching elements of the full-bridge rectifier. The controller may adjust the drive strength of the plurality of switching elements until a lowest DC voltage from the first spurious tone detection circuit is measured. The controller may be coupled to receive the first non-zero DC voltage and adjust a time when each switching element of the plurality of switching elements is conductive to minimize a voltage level of the first non-zero DC voltage.

In another embodiment, there is provided, a method including: rectifying a radio frequency (RF) signal using a full-bridge rectifier circuit having a plurality of switching elements and first and second RF terminals; detecting harmonic tones at the first RF terminal of the full-bridge rectifier circuit using a first spurious tone detection circuit having a first non-linear circuit element, the first spurious tone detection circuit coupled between the first RF terminal and a first reference terminal, the first spurious tone detection circuit providing a first non-zero direct current (DC) voltage in response to detecting the harmonic tones at the first RF terminal; providing a time-varying drive signal for driving the plurality of switching elements; and controlling the operation of the plurality of switching elements based at least in part on detecting the harmonic tones. The method may further include detecting harmonic tones at the second RF terminal of the full-bridge rectifier circuit using a second spurious tone detection circuit having a second non-linear circuit element, the second spurious tone detection circuit coupled between the second RF terminal and the first reference terminal, the second spurious tone detection circuit providing a second non-zero DC voltage in response to detecting harmonic tones at the second RF terminal. The method may further include: performing a calibration of the first and second spurious tone detection circuits, the calibration comprising coupling the first RF terminal to the second RF terminal; and applying an RF signal between the coupled together first and second RF terminals and the first reference terminal. The method may further include: detecting harmonic tones at the first RF terminal of the full-bridge rectifier circuit using a third spurious tone detection circuit having a third non-linear circuit element, the third spurious tone detection circuit coupled between the first RF terminal and a second reference terminal, the third spurious tone detection circuit providing a third non-zero DC voltage in response to detecting the harmonic tones at the first RF terminal; and detecting harmonics at the fourth RF terminal using a fourth spurious tone detection circuit having a fourth non-linear circuit element, the fourth spurious tone detection circuit coupled between the second RF terminal and the second reference terminal, the fourth spurious tone detection circuit providing a fourth non-zero DC voltage in response to detecting harmonic tones at the second RF terminal of the full-bridge rectifier circuit. During operation, the first reference terminal may be at a lower potential than a potential of the second reference terminal. Controlling the operation of the plurality of switching elements may further include controlling a drive strength of each switching element of the plurality of switching elements of the full-bridge rectifier. Controlling the operation of the plurality of switching elements may include adjusting the drive strength of the plurality of switching elements until a lowest DC voltage from the first spurious tone detection circuit is detected. Controlling the operation of the plurality of switching elements may include adjusting a time when each switching element of the plurality of switching elements is conductive to minimize a voltage level of the non-zero DC voltage. The plurality of switching elements may include a plurality of field-effect transistors. The first non-linear circuit element may include a diode.

FIG. 1 illustrates a wireless charging receiver 10 in accordance with the prior art. Wireless charging receiver 10 includes full-bridge rectifier 12, overvoltage protection 16 (limiter), voltage regulator 18 (e.g., a switched DC/DC converter), and capacitors 24 and 32.

Figure 2:
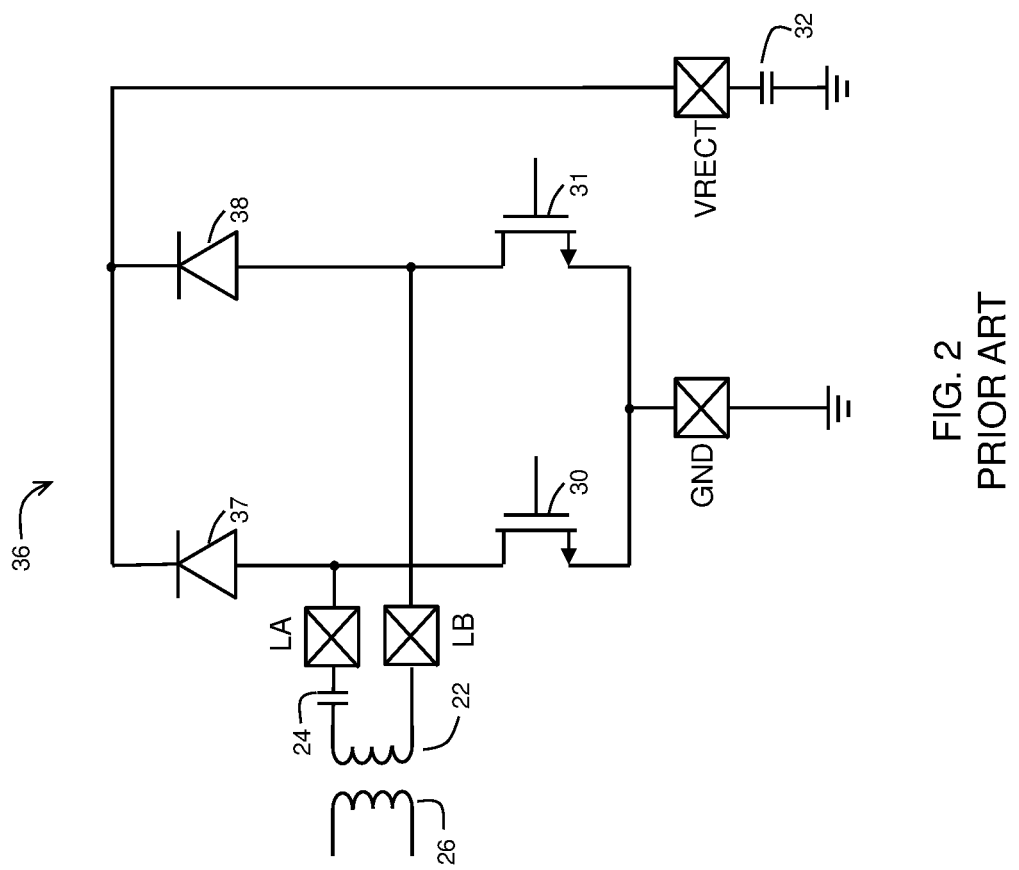
FIG. 2 illustrates a half-active rectifier circuit in accordance with the prior art.

Full-bridge rectifier 12 includes metal-oxide semiconductor field-effect transistors (MOSFETs) 28-31. Note that full-bridge rectifier 12 may be based on actively controlled transistors, such as the N-channel FETs shown, passive devices like Schottky diodes, or a combination of passive and active devices as shown in FIG. 2. Also, the active devices can be another transistor type such as bipolar transistors. Note that N-channel devices are used in the illustrated embodiment because an N-channel transistor has a smaller area than, e.g., a P-channel transistor for the same ON-resistance. However, in another embodiment, P-channel transistors may be used for full-bridge rectifier 12 and for other components in wireless charging receiver 10. In FIG. 1, overvoltage protection 16 includes N-channel transistor 33. Voltage regulator 18 includes N-channel transistor 34 and P-channel transistor 35. Full-bridge rectifier 12 is coupled to receiver coil 22 and capacitor 24 at terminals labeled LA and LB. Receiver coil 22 inductively couples with transmitter coil 26 of a wireless charging transmitter (not shown). During charging, an alternating current (AC) signal is received by receiver coil 22 and capacitor 24 due the resonant coupling with transmitter coil 26. The AC signal is provided to full-bridge rectifier 12 through capacitor 24 at terminals LA and LB. A switch controller (not shown) controls switching of transistors 28-31 of rectifier 12 on and off to produce a rectified voltage labeled "VRECT". The rectified voltage VRECT is generated, regulated, and provided to load 20 to an output voltage terminal labeled VOUT. Load 20 may be, e.g., a battery or a battery charger integrated circuit (IC) of an electronic device.

FIG. 2 illustrates a half-active full-bridge rectifier circuit 36 in accordance with the prior art. Half-active full-bridge rectifier circuit 36 combines diodes 37 and 38 and N-channel MOSFETs 30 and 31. Full-bridge rectifier circuit 12 in wireless charging receiver 10 of FIG. 1 may be replaced with half-active full-bridge rectifier circuit 36. Operation of rectifier circuit 36 is similar to the operation of rectifier 12 except that only transistors 30 and 31 are controlled by a switch controller.

Wireless Charging in the mega-Hertz (MHz) range suffers from at least two issues: switching losses due to the high operating frequency, and electromagnetic interference (EMI) caused by distorted voltages/currents on the antennas and printed circuit boards (PCBs).

Figure 3:
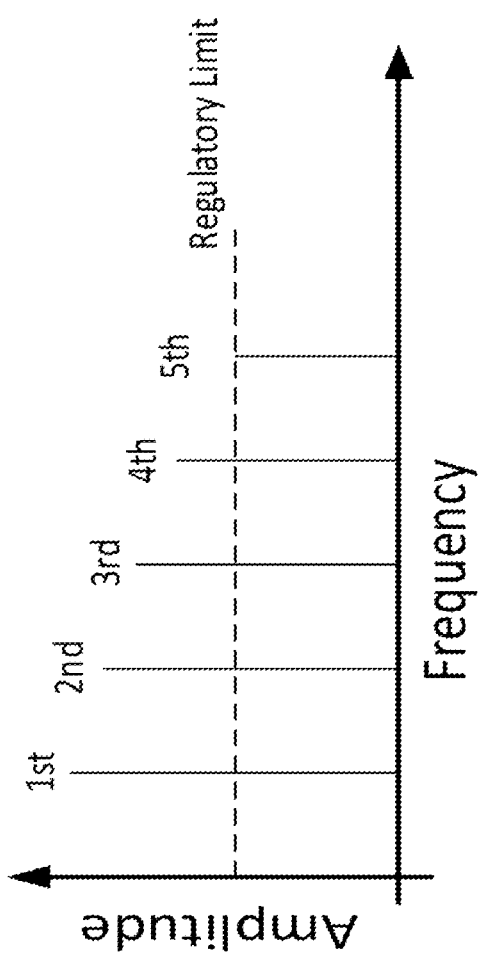
FIG. 3 illustrates a simplified spectrum of a distorted RF input signal.

FIG. 3 illustrates a simplified spectrum of a distorted RF input signal. Due to the nonlinear nature of the rectification provided by rectifiers 12 and 36, an antenna current and voltage are distorted which generates unwanted harmonic tones labeled $1^{st}$ through $5^{th}$ as shown in FIG. 3. The unwanted harmonics are then radiated by the antenna or any radiating element such as PCB traces or wires. Since the unwanted harmonic tones are at multiples of the fundamental tone, they may interfere with other radio devices or electronic circuits and therefore need to be kept below a regulatory limit applicable to the geographic location. The electromagnetic emissions can be split into even and odd harmonics of the fundamental frequency. Some causes for the different harmonics are described below.

The even numbered harmonics are generated by asymmetrical switching of the conduction devices (diodes or FETs) in the rectifier circuit such as full-bridge rectifiers 12 and 36. This asymmetry can be caused by a variation of the electrical parameters of the switching devices or by an asymmetrical layout of the PCB traces or on-chip wiring. In accordance with an embodiment as shown in FIG. 4, a spurious tone detection and regulation circuit in connection with a switch controller described below can detect the strength of these unwanted even harmonics and reduce their amplitude by individually adjusting the ON-time and/or conduction strength of the switches in the rectifier circuit.

Regarding the odd harmonics, in an ideal rectifier, the switching devices of the rectifier will only conduct if the AC input signal has a larger amplitude than the DC output. Otherwise, energy would flow in a reverse direction and the efficiency of the rectification will drop significantly. The finite ON-time of the switches causes the voltage or the current to become non-sinusoidal, depending on the source impedance.

Figure 4:
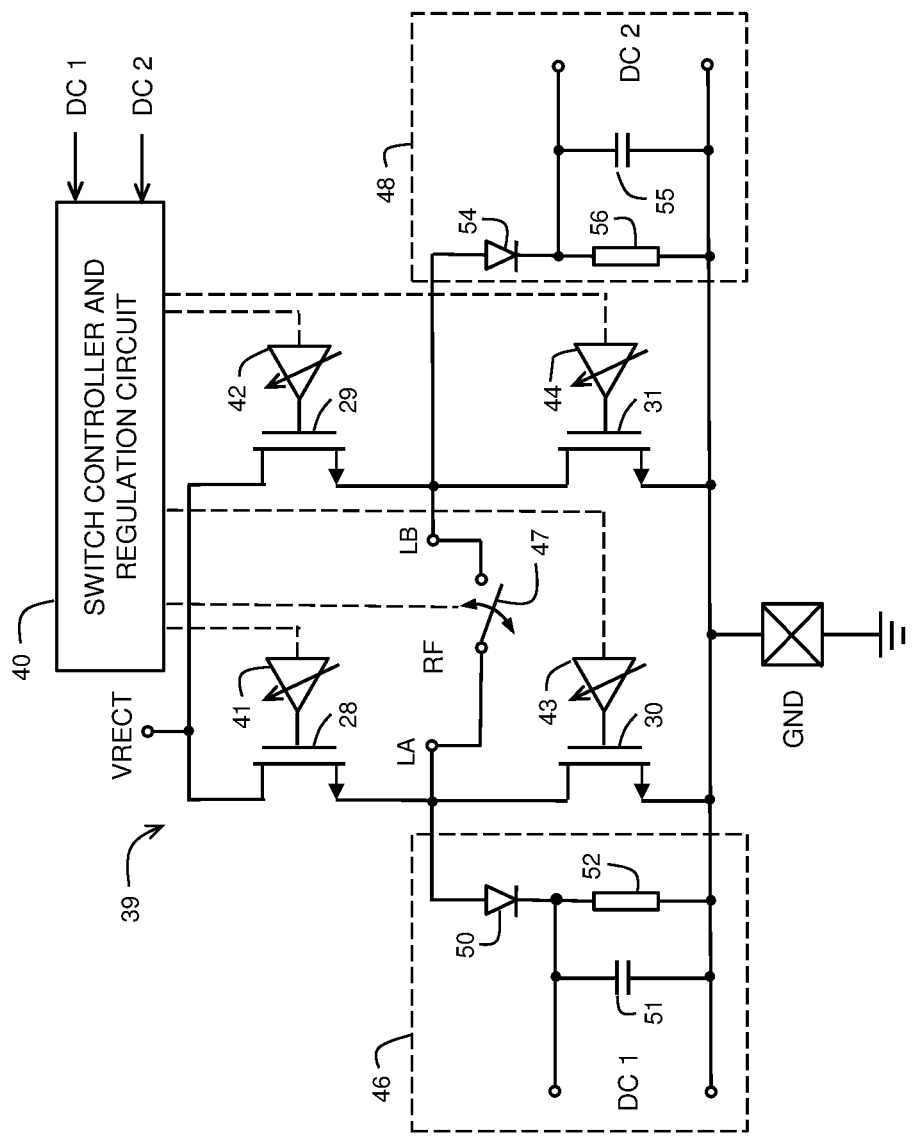
FIG. 4 illustrates a full-bridge rectifier circuit coupled to a spurious tone detection circuit in accordance with an embodiment.

FIG. 4 illustrates full-bridge rectifier circuit 39 coupled to spurious tone detection circuits 46 and 48 in accordance with an embodiment. Full-bridge rectifier circuit 39, spurious tone detection circuits 46 and 48, and switch controller and regulation circuit 40 may be used in a wireless charging receiver such as wireless charging receiver 10 in FIG. 1. In another embodiment, full-bridge rectifier circuit 39 and spurious tone detection circuits 46 and 48 may be used in a wired device, such as a wired near field communications (NFC) device. In one embodiment, the wireless charging receiver may be implemented on a single IC. In other embodiments, the wireless charging receiver may be implemented differently. In FIG. 4, full-bridge rectifier 39 includes N-channel MOSFETs 28-31 and driver circuits 41-44. Switch controller and regulation circuit 40 controls the conductivity and drive strength of transistors 28-31 in response to receiving DC voltages DC 1 and DC 2 from spurious tone detection circuits 46 and 48. Spurious tone detection circuit 46 includes diode 50, capacitor 51, and resistor 52. Spurious tone detection circuit 48 includes diode 54, capacitor 55, and resistor 56. In detection circuit 46, diode 50 has a first terminal connected to RF terminal LA, and a second terminal. Capacitor 51 has a first terminal connected to the second terminal of diode 50, and a second terminal connected to a reference terminal labeled GND. In the illustrated embodiment, the reference terminal GND is coupled to ground. In another embodiment, the reference terminal may be coupled to a lower potential than a potential of terminal VRECT. Resistor 52 has first terminal connected to the second terminal of diode 50, and a second terminal connected to reference terminal GND. The components of detection circuit 48 are connected together the same as detection circuit 46. Detection circuit 46 provides DC voltage DC 1 and detection circuit 48 provides DC voltage DC 2. Switch 47 is connected between RF terminals LA and LB. In one embodiment, switch 47, switches 28-31, and driver circuits 41-44 are controlled by logic or software associated with the operation of switch controller 40 as indicated by dashed lines from controller 40 to switches 28-31 and switch 47 in response to DC voltages DC 1 and DC 2. As mentioned above, full-bridge rectifier 39 with the spurious tone detection circuits 46 and 48 may be used in a wireless charging receiver as shown above in FIG. 1. In response to inductively receiving a charging voltage from a wireless charging transmitter, full-bridge rectifier 39 provides a rectified voltage at a terminal labeled VRECT. In one embodiment, a wireless charging receiver with spurious tone detection circuits 46 and 48 may be used for small form factor devices like smart watches and wireless headphones and earbuds.

In accordance with an embodiment, the wireless charging receiver with spurious detection circuits 46 and 48 may operate around 13.56 MHz, a frequency used by NFC devices. This frequency provides a relatively good compromise between antenna size and power conversion efficiency although the disclosed wireless charging receiver is not limited to this frequency. Also, the inductive coupling between the coils of the wireless charging receiver and a wireless charging transmitter may be used for communications according to, e.g., an NFC protocol.

In operation, spurious tone detection circuits 46 and 48 down-convert detected AC input voltages at terminals LA and LB to DC voltages at outputs of the detectors. The detected DC voltages are used by switch controller and regulation circuit 40 to minimize a voltage level of a differential DC voltage measured between the detector outputs by controlling the switches of the full-bridge rectifier to minimize the differential DC voltage and thus suppress unwanted EMI. As mentioned above, in one embodiment, controller 40 adjusts a time when each of the switching elements is conductive. In another embodiment, controller 40 adjusts a drive strength of each of the plurality of switches. By controlling the ON time or drive strength, the detected differential DC voltage between the two detector outputs is minimized to remove or at least reduce the harmonics that cause EMI.

DC outputs DC 1 and DC 2 from spurious tone detection circuits 46 and 48 are provided to a regulation mechanism to lower the generated EMI. In one embodiment, the regulation mechanism may be hardware or software used in connection with switch controller and regulation circuit 40 to control switching of transistors 28-31 and to control driver stages 41-44. Full-bridge rectifier 39 with four active devices such as FET transistors 28-31 converts an RF signal from an antenna, such as a coil, to a DC voltage to supply the electronic device or charge a battery. In another embodiment, FET transistors 28-31 may be bipolar transistors. Not all switching devices need to be actively controllable. It is also possible to combine diodes and transistors in the circuit as shown in FIG. 2 above. The outputs of spurious tone detection circuits 46 and 48 are used to control the ON-time and/or the conduction strength of the individual switches in order to cancel the unwanted spurious harmonic tones.

The on-chip spurious tone detection circuit is constructed using an integrated non-linear circuit element which down-converts the unwanted spurious tones of the rectifier circuit to a measurable DC component. The DC component is measured and minimized to remove or reduce unwanted spurious tones. A non-linear element is used to perform a self-mixing where the RF signal components are mixed together which will result in a DC component and many higher frequency mixing components. In the illustrated embodiment, the non-linear element for each of spurious tone detection circuits 46 and 48 is a diode, such as diodes 50 and 54 shown in FIG. 4. In other embodiments, other non-linear elements like bipolar junction transistors (BJTs) or FETs may be used. A subsequent low pass filter removes the higher frequency components from the output. Capacitors 51 and 55 function as low pass filters. The spurious tone detection circuits 46 and 48 monitor the harmonic tones and can be constructed using any nonlinear circuit element. In this example, the two diodes are used to perform a self-mixing of the RF signal and down convert the harmonics to a corresponding DC component.

The non-linear relation between voltage and current of an ideal diode is given by:

$$I_D = I_S \left( e^{\frac{V_D}{nV_T}} - 1 \right)$$

where $I_D$ is the diode current, $I_S$ is the saturation current, $V_D$ is the diode voltage, $V_T$ is the thermal voltage, and n is the diode ideality factor. The exponential can be expanded as:

$$e^x - 1 \approx x + \frac{x^2}{2}$$

Because the voltage across the diode contains all harmonics which exist between the RF input and the rectified ground, then (disregarding the constants in the diode equation) the diode current can be written as:

$$I_D = [A \cdot \cos(2\pi f \cdot t) + B \cdot \cos(4\pi f \cdot t) + \ldots] + \frac{1}{2}[A \cdot \cos(2\pi f \cdot t) + B \cdot \cos(4\pi f \cdot t) + \ldots]^2 + \ldots$$

The first term contains the original signals which are at the fundamental frequency and all even and odd harmonics. The square of the sum can be expanded to the squares of the individual harmonics as well as the product of all tones. It can be shown that the products create all sum and difference frequencies, and the squares will create a DC component. In a symmetrical rectifier, the differential DC signal between the two spurious tone detector circuits 46 and 48 is zero, as both outputs are equal and symmetrical. When an imbalance between the two sides of the rectifier exists, a differential voltage between the two detector circuit outputs DC 1 and D 2 will be non-zero.

Circuit components such as diodes 50 and 54 will likely not be identical because of, for example, manufacturing variations. During operation of the spurious tone detector circuits 46 and 48, a mismatch voltage may be produced because of the diode variations. The mismatch of diodes 50 and 54 should be removed in order to produce accurate results with spurious tone detection circuits 46 and 48. Therefore, in one embodiment, a calibration of spurious tone detection circuits 46 and 48 is performed to remove the diode mismatch voltage. During the calibration, switch 47 is closed to connect both RF terminals LA and LB together. An RF signal is then applied between the connected together terminals LA and LB and ground (GND). With the same RF input signal, a remaining measured mismatch voltage at the output terminals of detectors 46 and 48 is caused by a mismatch of the diodes and may be measured and stored. During operation of full-bridge rectifier 39 and detectors 46 and 48, the mismatch voltage can be subtracted from the measurement of the differential DC voltage to produce more accurate results.

Figure 5:
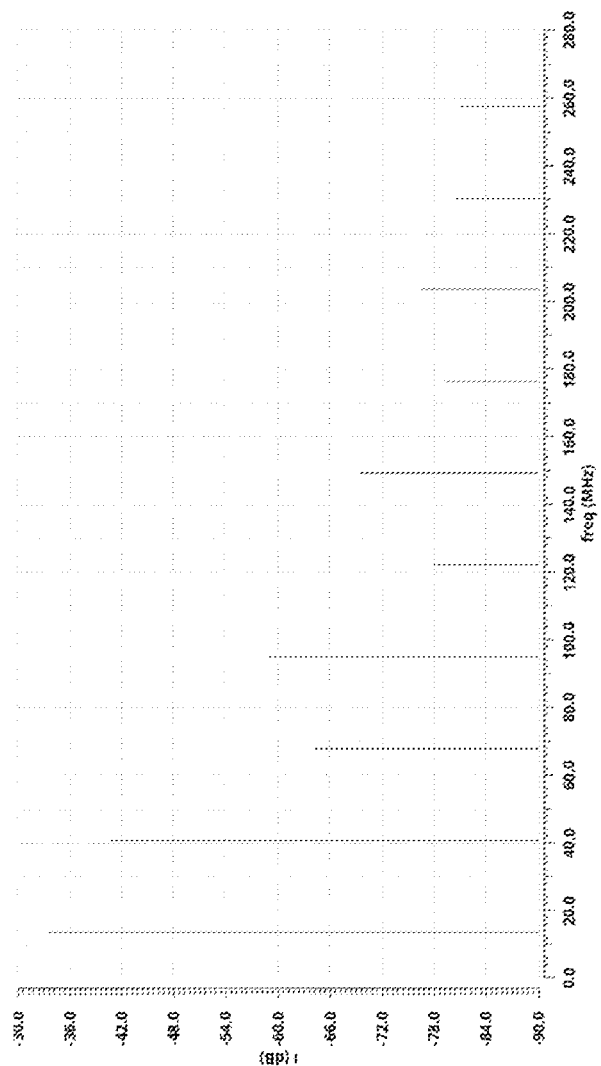
FIG. 5 illustrates an input current spectrum for ideal switching.

FIG. 5 illustrates an input current spectrum for ideal switching. In the case of ideal switching, the on and off times of the switching devices are nearly identical, and the rectified signals are symmetrical with respect to the RF input signals. This means the voltage between either of the two DC signals DC 1 or DC 2 and one of the RF signals at terminals LA or LB are nearly identical except for a phase shift of 180°. This leads to virtually no even harmonics in the input voltages and currents as illustrated in FIG. 5. In FIG. 5, for operation of a wireless charging device at 13.56 MHz, a $2^{nd}$ harmonic, if present, would be at 27.12 MHz, a $4^{th}$ harmonic would be at 54.34 MHz, a $6^{th}$ harmonic would be at 81.36 MHz, and an $8^{th}$ harmonic would be at 108.48 MHz.

Figure 6:
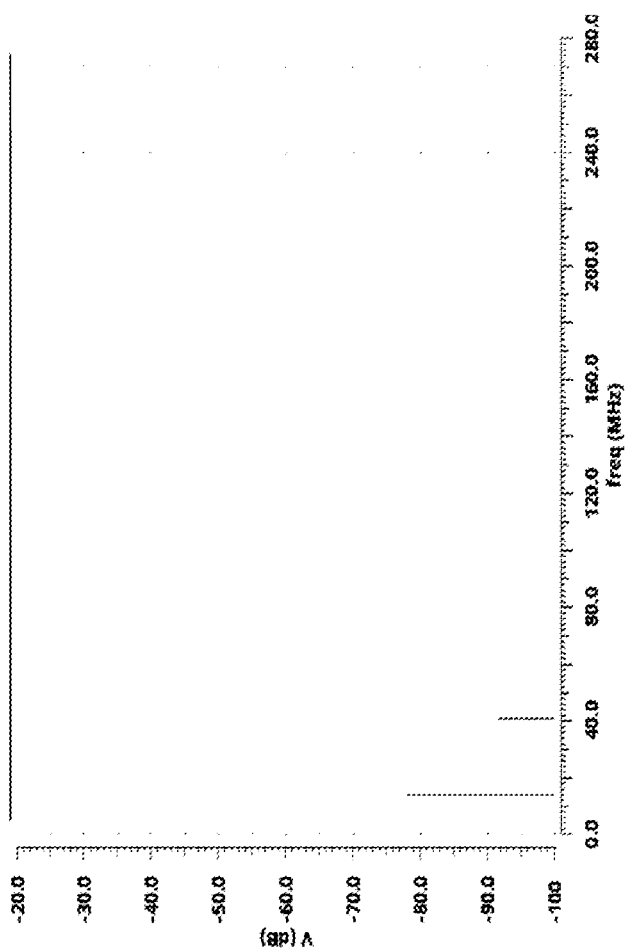
FIG. 6 illustrates a spurious tone detector output for an ideal (fully symmetrical) rectifier.

FIG. 6 illustrates a spurious tone detector output for an ideal (fully symmetrical switching) rectifier. FIG. 6 shows the output spectrum for a spurious tone detector circuit where no DC component is present due to the absence of even harmonics in a fully symmetrical rectifier.

Figure 7:
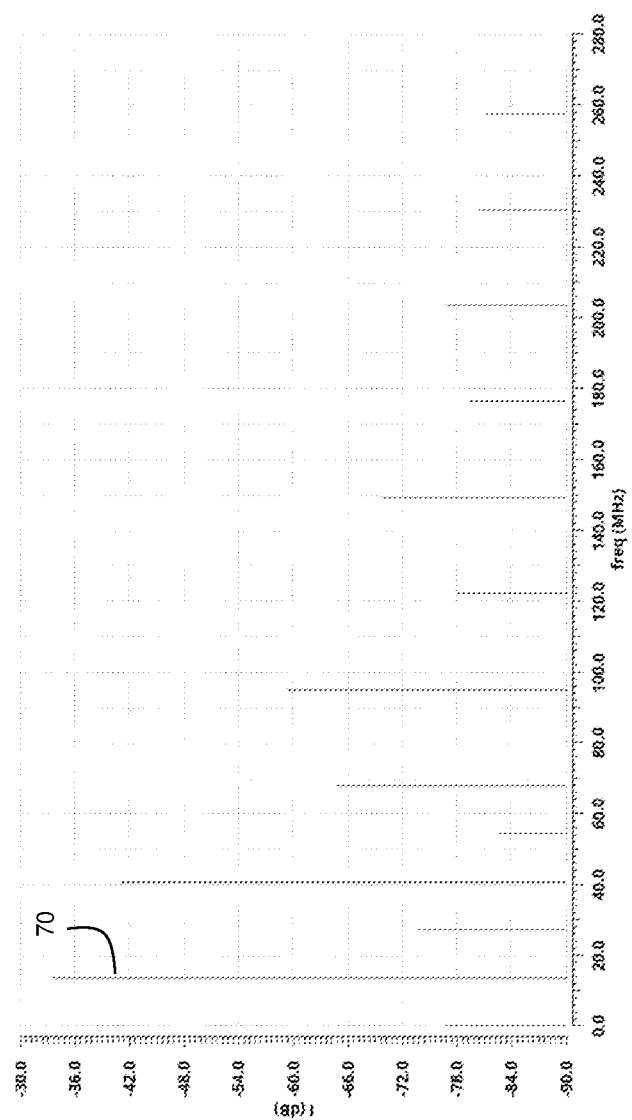
FIG. 7 illustrates input current with a relatively strong $2^{nd}$ harmonic due to asymmetrical switching in one of the rectifier switches.

FIG. 7 illustrates input current with a relatively strong $2^{nd}$ harmonic 70 of about −33.4 decibels (dB) due to asymmetrical switching in one or more of the full-bridge rectifier switches. A non-zero differential DC voltage is measured at the outputs of the spurious tone detection circuits 46 and 48 indicating even harmonics are generated in the input current and voltages as shown in FIG. 7.

Figure 8:
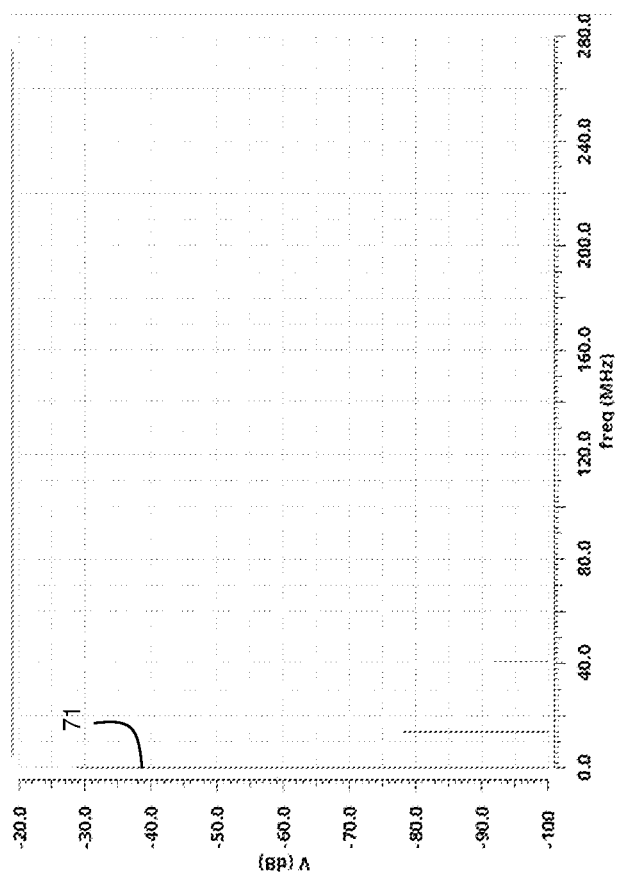
FIG. 8 illustrates a non-zero DC component at the spurious tone detection circuit output due to asymmetrical switching.

FIG. 8 illustrates an example DC component 71 of about −31 dB at the output of spurious tone detection circuits 46 and 48 due to asymmetrical switching. In order to detect and suppress unwanted even harmonics, on-chip spurious tone detection circuits 46 and 48 are implemented by exploiting the non-linear behavior of either diodes or transistors. In the example shown in FIG. 4, a diode is used to detect the even harmonics of the AC input signal. Spurious tone detector circuits 46 and 48 convert this signal to an equivalent DC voltage which is provided to switch controller 40 in FIG. 4 and used to adjust the ON-time of the switches of full-bridge rectifier circuit 39.

Figure 9:
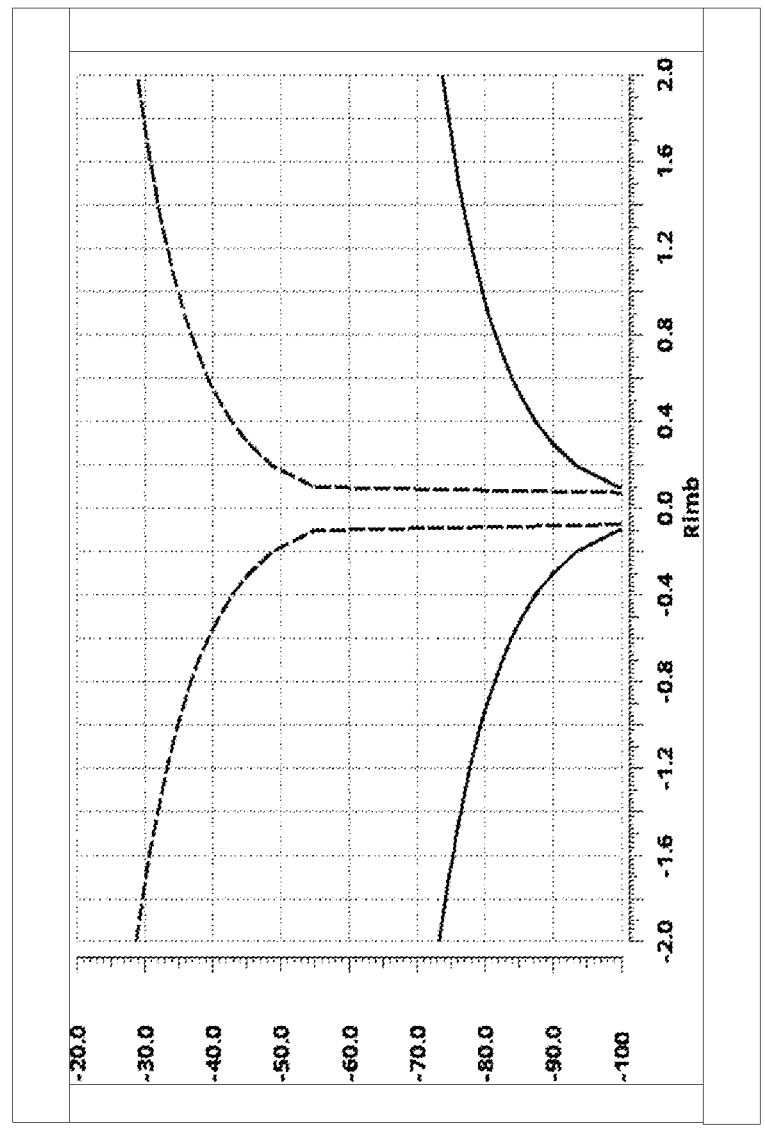
FIG. 9 illustrates unwanted $2^{nd}$ harmonic level (solid line) and spurious tone detection circuit output (dashed line) as a function of switch imbalance.

FIG. 9 illustrates an unwanted $2^{nd}$ harmonic (solid line) and spurious tone detection circuit 46 output (dashed line) as a function of switch imbalance (Rimb). In FIG. 9, the vertical scale is decibels (dB) and switch imbalance (Rimb) is on the horizontal scale. The outputs of detectors 46 and 48 are fed into a regulation circuit portion of switch controller and regulation circuit 40 which can be implemented using either analog circuitry or digital logic cells. In one embodiment, the regulation circuit may be separate from switch controller 40. The regulation circuit controls the drive strength or ON time of the transistors in full-bridge rectifier 39 in order to minimize the differential DC voltage and amplitude of the DC output. The regulation circuit increases or decreases the drive strength and/or ON-time of the switches and may perform a gradient search to find the minimum differential DC voltage.

Figure 10:
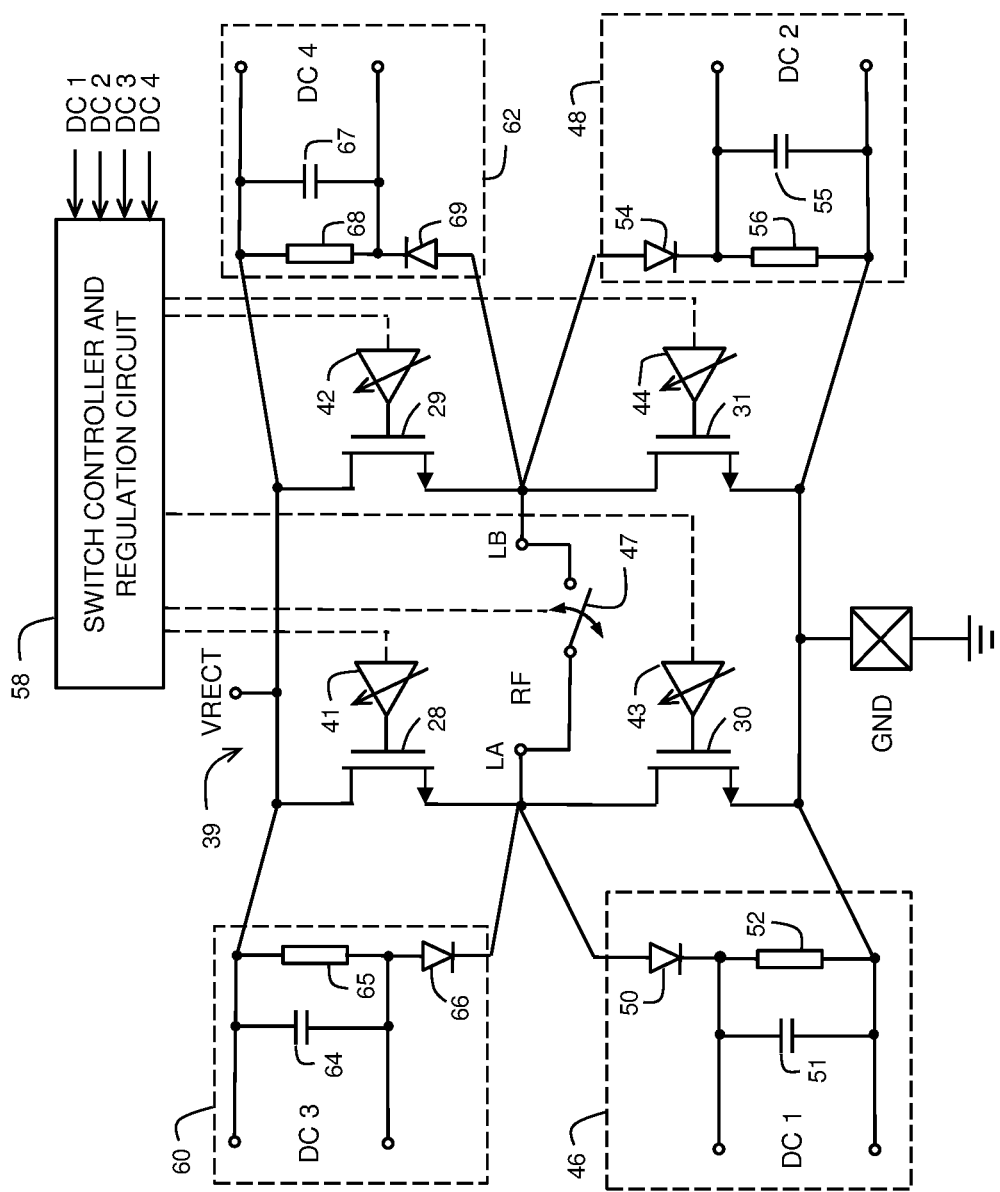
FIG. 10 illustrates a full-bridge rectifier circuit coupled to a spurious tone detection circuit in accordance with another embodiment.

FIG. 10 illustrates full-bridge rectifier circuit 39 coupled to spurious tone detection circuits 46, 48, 60, and 62 in accordance with another embodiment. FIG. 10 is basically the same as FIG. 4 except that two additional spurious tone detection circuits 60 and 62 are coupled across transistors 28 and 29, respectively. Spurious tone detection circuit 60 includes capacitor 64, resistor 65, and diode 66. Spurious tone detection circuit 62 includes capacitor 67, resistor 68, and diode 69. DC voltage DC 3 from spurious tone detection circuit 60 and DC voltage DC 4 from detection circuit 62 are provided to switch controller and regulation circuit 58. Operation of full-bridge rectifier 39 and detector circuits 46, 48, 60, and 62 is similar to the operation of rectifier circuit 39 and detector circuits 46 and 48 of FIG. 4, except that spurious tone detection circuits 60 and 62 should also be calibrated as discussed above. The calibrations are performed prior to detector circuits 46, 48, 60, and 62 being used to remove a mismatch voltage between DC voltages DC 1 and DC 2 and a mismatch voltage between DC voltage DC 3 and DC 4. The two mismatch voltages may be stored and subtracted from the measured differential DC voltages during operation.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Generally, in the above described embodiment, a current electrode is a source or drain and a control electrode is a gate of a metal-oxide semiconductor (MOS) transistor. Other transistor types may be used in other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An electronic circuit comprising:
   a full-bridge rectifier circuit having first and second radio frequency (RF) terminals and a plurality of switching elements;
   a first spurious tone detection circuit having a first non-linear circuit element, the first spurious tone detection circuit coupled between the first RF terminal and a first reference terminal, the first spurious tone detection circuit providing a first non-zero direct current (DC) voltage in response to detecting harmonic tones at the first RF terminal of the full-bridge rectifier circuit; and
   a controller coupled to the plurality of switching elements, the controller for controlling the operation of the plurality of switching elements based at least in part on detecting the harmonic tones.

2. The electronic circuit of claim 1 further comprising a second spurious tone detection circuit having a second non-linear circuit element, the second spurious tone detection circuit coupled between the second RF terminal and the first reference terminal, the second spurious tone detection circuit providing a second non-zero DC voltage in response to detecting harmonic tones at the second RF terminal of the full-bridge rectifier circuit.

3. The electronic circuit of claim 2, further comprising third and fourth spurious detection circuits, the third spurious tone detection circuit having a third non-linear circuit element, the third spurious tone detection circuit coupled between the first RF terminal and a second reference terminal, the third spurious tone detection circuit providing a third non-zero DC voltage in response to detecting harmonic tones at the first RF terminal of the full-bridge rectifier circuit; and the fourth spurious tone detection circuit having a fourth non-linear circuit element, the fourth spurious tone detection circuit coupled between the second RF terminal and the second reference terminal, the fourth spurious tone detection circuit providing a fourth non-zero DC voltage in response to detecting harmonic tones at the second RF terminal of the full-bridge rectifier circuit.

4. The electronic circuit of claim 3, wherein during operation, the first reference terminal is at a lower potential than a potential the second reference terminal.

5. The electronic circuit of claim 1, wherein the full-bridge rectifier comprises a combination of transistors and diodes.

6. The electronic circuit of claim 1, wherein the first non-linear circuit element is a diode.

7. The electronic circuit of claim 1, wherein the first spurious tone detection circuit further comprises:
   a diode having a first terminal coupled to the first RF terminal of the full-bridge rectifier, and a second terminal;
   a capacitor having a first terminal coupled to the second terminal of the diode, and a second terminal coupled to the first reference terminal; and
   a resistive element having a first terminal coupled to the second terminal of the diode, and a second terminal coupled to the first reference terminal.

8. The electronic circuit of claim 1, wherein the controller is coupled to receive the first non-zero DC voltage, and in response, control a drive strength of the plurality of switching elements of the full-bridge rectifier.

9. The electronic circuit of claim 8, wherein the controller adjusts the drive strength of the plurality of switching elements until a lowest DC voltage from the first spurious tone detection circuit is measured.

10. The electronic circuit of claim 1, wherein the controller is coupled to receive the first non-zero DC voltage and adjust a time when each switching element of the plurality of switching elements is conductive to minimize a voltage level of the first non-zero DC voltage.

11. A method comprising:
    rectifying a radio frequency (RF) signal using a full-bridge rectifier circuit having a plurality of switching elements and first and second RF terminals;
    detecting harmonic tones at the first RF terminal of the full-bridge rectifier circuit using a first spurious tone detection circuit having a first non-linear circuit element, the first spurious tone detection circuit coupled between the first RF terminal and a first reference terminal, the first spurious tone detection circuit providing a first non-zero direct current (DC) voltage in response to detecting the harmonic tones at the first RF terminal;
    providing a time-varying drive signal for driving the plurality of switching elements; and
    controlling the operation of the plurality of switching elements based at least in part on detecting the harmonic tones.

12. The method of claim 11, further comprising detecting harmonic tones at the second RF terminal of the full-bridge rectifier circuit using a second spurious tone detection circuit having a second non-linear circuit element, the second spurious tone detection circuit coupled between the second RF terminal and the first reference terminal, the second spurious tone detection circuit providing a second non-zero DC voltage in response to detecting harmonic tones at the second RF terminal.

13. The method of claim 12, further comprising:
performing a calibration of the first and second spurious tone detection circuits, the calibration comprising coupling the first RF terminal to the second RF terminal; and
applying an RF signal between the coupled together first and second RF terminals and the first reference terminal.

14. The method of claim 12, further comprising:
detecting harmonic tones at the first RF terminal of the full-bridge rectifier circuit using a third spurious tone detection circuit having a third non-linear circuit element coupled, the third spurious tone detection circuit between the first RF terminal and a second reference terminal, the third spurious tone detection circuit providing a third non-zero DC voltage in response to detecting the harmonic tones at the first RF terminal; and
detecting harmonics at the fourth RF terminal using a fourth spurious tone detection circuit having a fourth non-linear circuit element, the fourth spurious tone detection circuit coupled between the second RF terminal and the second reference terminal, the fourth spurious tone detection circuit providing a fourth non-zero DC voltage in response to detecting harmonic tones at the second RF terminal of the full-bridge rectifier circuit.

15. The method of claim 14, wherein during operation, the first reference terminal is at a lower potential than a potential of the second reference terminal.

16. The method of claim 11, wherein controlling the operation of the plurality of switching elements further comprises controlling a drive strength of each switching element of the plurality of switching elements of the full-bridge rectifier.

17. The method of claim 16, wherein controlling the operation of the plurality of switching elements comprises adjusting the drive strength of the plurality of switching elements until a lowest DC voltage from the first spurious tone detection circuit is detected.

18. The method of claim 11, wherein controlling the operation of the plurality of switching elements comprises adjusting a time when each switching element of the plurality of switching elements is conductive to minimize a voltage level of the non-zero DC voltage.

19. The method of claim 11, wherein the plurality of switching elements comprises a plurality of field-effect transistors.

20. The method of claim 11, wherein the first non-linear circuit element comprises a diode.

* * * * *